United States Patent
Hashimoto

(10) Patent No.: US 6,720,205 B2
(45) Date of Patent: Apr. 13, 2004

(54) ELECTRONIC DEVICE AND METHOD OF MANUFACTURING THE SAME, AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/359,477

(22) Filed: Feb. 5, 2003

(65) Prior Publication Data

US 2003/0170931 A1 Sep. 11, 2003

(30) Foreign Application Priority Data

Mar. 6, 2002 (JP) ........................................ 2002-060311

(51) Int. Cl.[7] ............................................... H01L 21/44
(52) U.S. Cl. ........................ 438/106; 438/125; 438/126; 438/110; 257/690; 257/692; 257/701; 257/773
(58) Field of Search ................................. 438/106, 125, 438/126, 110; 257/690, 692, 701, 773

(56) References Cited

U.S. PATENT DOCUMENTS

2003/0049887 A1 * 3/2003 Wada et al. ................. 438/106

FOREIGN PATENT DOCUMENTS

JP 08-139126 5/1996

OTHER PUBLICATIONS

U.S. patent application Ser. No. 10/361,839 Hashimoto filed Feb. 10, 2003.

* cited by examiner

Primary Examiner—Amir Zarabian
Assistant Examiner—Christy Novacek
(74) Attorney, Agent, or Firm—Hogan & Hartson, LLP

(57) ABSTRACT

After electrically connecting first interconnecting lines respectively to a first group of electrodes of an integrated circuit chip, second interconnecting lines are electrically connected to a second group of electrodes of the integrated circuit chip, respectively. The pitch of the first group of electrodes is wider than that of the second group of electrodes. A first support member has a larger rate of deformation due to at least one of heat and humidity than a second support member.

9 Claims, 4 Drawing Sheets

ELECTRONIC DEVICE AND METHOD OF MANUFACTURING THE SAME, AND ELECTRONIC INSTRUMENT

Japanese Patent application No. 2002-60311, filed on Mar. 6, 2002, is hereby incorporated by reference in its entirety.

BACKGROUND OF THE INVENTION

The present invention relates to an electronic device and method of manufacturing the electronic device, and to an electronic instrument.

In a liquid crystal panel, for the electrical connection of an IC chip having a drive circuit, TAB (Tape Automated Bonding), COF (Chip On Film) mounting, or COG (Chip On Glass) mounting is applied.

With conventional TAB (Tape Automated Bonding) or COF (Chip On Film) mounting, interconnecting lines formed on the tape or film are bonded to interconnecting lines of the liquid crystal panel. Since the liquid crystal panel has a large number of interconnecting lines formed at a narrow pitch, and the tape or film tends to expand or contract, positioning discrepancies of the bonding portions of the interconnecting lines tend to occur. For this reason, it has been difficult to assure the electrical connections. Using conventional COG (Chip On Glass) mounting, a semiconductor chip is mounted on the liquid crystal panel, and therefore a large mounting area (a so-called frame) has been necessary.

BRIEF SUMMARY OF THE INVENTION

A method of manufacturing an electronic device of the present invention comprises:

electrically connecting first interconnecting lines provided on a first support member respectively to a first group of electrodes of an integrated circuit chip; and then electrically connecting second interconnecting lines provided on a second support member respectively to a second group of electrodes of the integrated circuit chip, the second support member having a rate of deformation due to at least one of heat and humidity less than the deformation rate of the first support member, and the second group of electrodes having a pitch less than the pitch of the first group of electrodes of the integrated circuit chip.

An electronic device of the present invention is manufactured by the above described method.

An electronic instrument of the present invention comprises the above described electronic device.

DETAILED DESCRIPTION OF THE EMBODIMENT

Figure 1:
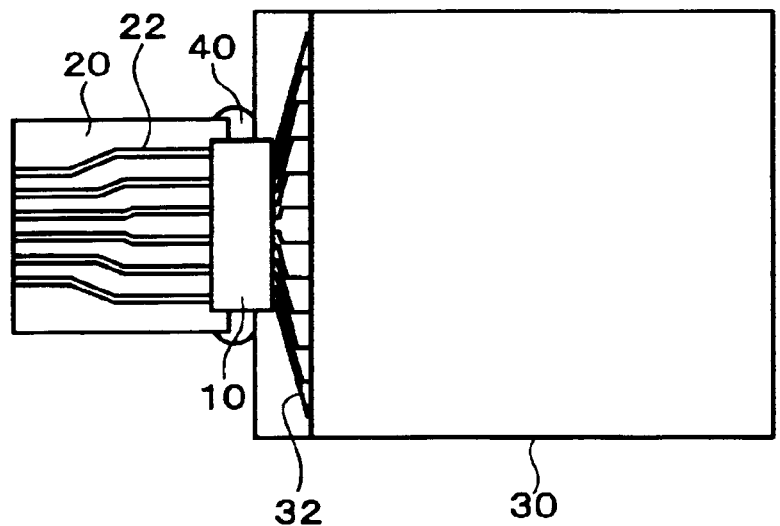
FIG. 1 is a diagram showing an electronic device according to one embodiment of the present invention.

Embodiments of the present invention can provide an electronic device which reliably obtains electrical conductivity without increasing a mounting region, a method of manufacturing such an electronic device, and an electronic instrument.

(1) According to one embodiment of the present invention, there is provided a method of manufacturing an electronic device comprising:

electrically connecting first interconnecting lines provided on a first support member respectively to a first group of electrodes of an integrated circuit chip; and then electrically connecting second interconnecting lines provided on a second support member respectively to a second group of electrodes of the integrated circuit chip, the second support member having a rate of deformation due to at least one of heat and humidity less than the deformation rate of the first support member, and the second group of electrodes having a pitch less than the pitch of the first group of electrodes of the integrated circuit chip.

According to this embodiment of the present invention, the first interconnecting lines are formed on the first support member with a high deformation rate at a relatively wide pitch, so that the first group of electrodes and the first interconnecting lines can be reliably electrically connected. Since only the part of the integrated circuit chip on which the second group of electrodes is formed is mounted on the second support member, there is no requirement for a large mounting region.

(2) In this method of manufacturing an electronic device, a gap may be provided between the first support member and second support member.

(3) In this method of manufacturing an electronic device, the first support member may be a flexible substrate.

According to this configuration, an integrated circuit chip is first mounted on a flexible substrate. The flexible substrate is, as its name implies, flexible, and therefore when the integrated circuit chip is subsequently mounted on the second substrate, stress is less likely to be imparted to the integrated circuit chip from the flexible substrate. Therefore, the second group of electrodes and the second interconnecting lines can be reliably electrically connected.

(4) In this method of manufacturing an electronic device, the second support member may be a glass substrate.

(5) In this method of manufacturing an electronic device, the thickness of the first support member may be less than the thickness of the second support member.

According to this configuration, since the integrated circuit chip is first mounted on the thinner first support member, the integrated circuit chip can be mounted on the second support member by placing the thicker second support member on a flat base.

(6) In this method of manufacturing an electronic device, the second support member may be part of an electro-optic panel.

(7) This method of manufacturing an electronic device may further comprise: filling between the first and second support members with a resin.

(8) According to one embodiment of the present invention, there is provided an electronic device manufactured by the above described method.

(9) According to one embodiment of the present invention, there is provided an electronic instrument comprising the above described electronic device.

Figure 2:
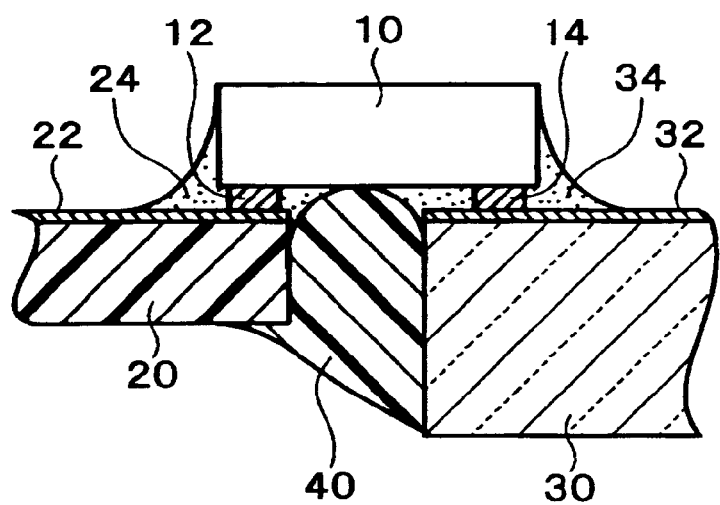
FIG. 2 is an enlarged sectional view showing a part of an electronic device according to one embodiment of the present invention.

Embodiments of the present invention will be described with reference to the drawings. FIG. 1 shows an electronic device according to one embodiment of the present invention, FIG. 2 is an enlarged sectional view of a part of the electronic device, and FIG. 3 is an enlarged plan view of a part of the electronic device.

The electronic device has an integrated circuit chip (IC chip) 10. The integrated circuit chip 10 is a semiconductor chip. integrated circuit chip 10 may be a rectangular prism (a rectangle in plan view). The integrated circuit chip 10 has at least a first group of electrodes 12 and a second group of electrodes 14. For example, as shown in FIG. 3, of two parallel edges of the integrated circuit chip 10 (for example, the long edges of the rectangle seen in plan view), the first row of electrodes 12 maybe arranged along one edge, and the second row of electrodes 14 arranged along the other edge. In this case, for the electrode arrangement, it is preferable that the integrated circuit chip 10 is of the peripheral type. The plurality of first electrodes constituting the first group of electrodes 12 and the plurality of second electrodes constituting the second group of electrodes 14 may each include, for example, a pad formed of aluminum or the like, and a bump or the like of gold or the like formed thereon. Furthermore, between the pad and the bump may be included a metal film of an under bump metal or the like. For example, as the material of this metal film may be cited TiW, Pt, and the like.

Figure 3:
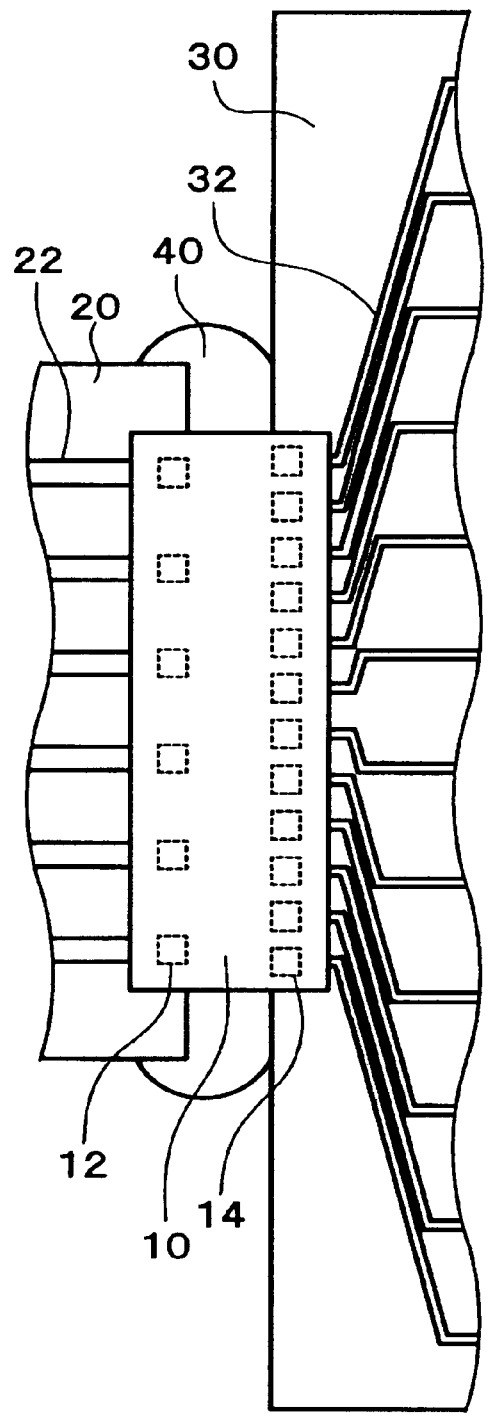
FIG. 3 is an enlarged sectional view showing a part of an electronic device according to one embodiment of the present invention.

As shown in FIG. 3, the pitch of the first electrodes constituting the first group of electrodes 12 is formed to be wider than the pitch of the second electrodes constituting the second group of electrodes 14. The integrated circuit chip 10 has an internal driver (for example, a drive circuit for an electro-optic panel (liquid crystal panel or electro luminescence panel or the like)). In this embodiment, the first group of electrodes 12 constitutes input terminals to the driver, and the second group of electrodes 14 constitutes output terminals from the driver.

The electronic device comprises a first support member 20. The first support member 20 may be a substrate (for example, a flexible substrate or film, or a rigid substrate). The first support member 20 may be such that the deformation rate for at least one of heat and humidity (the thermal expansion rate or the like) is greater than that of a second support member 30. It should be noted that since the deformation rate does not depend solely on the material, separated examples have been given. For example, the first support member 20 may be formed of a material (for example, polyimide or similar resin) which has a deformation rate for at least one of heat and humidity (thermal expansion rate or the like) greater than that of the second support member 30. The first support member 20 may be thinner than the second support member 30. On the first support member 20 are formed first interconnecting lines 22. The first support member 20 on which the first interconnecting lines 22 are formed may be an interconnecting line substrate. The first interconnecting lines 22 may be formed on both surfaces of the support member 20, or maybe formed in multiple layers on the surface of and internally to the support member 20. The first interconnecting lines 22 are formed extending to both extremities across the lateral direction (or longitudinal direction) of the first support member 20. The first interconnecting lines 22 may, as shown in FIG. 1, be formed with the pitch at one extremity different from the other extremity, or may be formed with the pitch the same.

At one extremity (for example, the end with a wider pitch), the first interconnecting lines 22 are electrically connected to the first group of electrodes 12 of the integrated circuit chip 10. That is to say, on the first support member 20, at one extremity of the first interconnecting lines 22 (for example, the end with a wider pitch) the portions (extremities) have the integrated circuit chip 10 mounted. The other extremity of the first interconnecting lines 22 (for example, the end with a narrower pitch), may be connected to a circuit board (motherboard) or the like not shown in the drawings. On the first support member 20, in addition to the integrated circuit chip 10, other electronic components (for example, surface mounting components) not shown in the drawings may be mounted.

The electronic device comprises a second support member 30. The second support member 30 maybe a substrate (for example, a glass substrate). The second support member 30 may be part of an electro-optic panel (liquid crystal panel, electroluminescence panel, or the like). On the second support member 30, second interconnecting lines 32 are formed. The second interconnecting lines 32 may be formed so that the pitch widens at one extremity. The pitch may be formed so as to be substantially equal at both extremities (so that adjacent interconnecting lines are substantially parallel).

At one extremity of the second interconnecting lines 32 (for example, the end with a narrower pitch) portions are electrically connected to the second group of electrodes 14 of the integrated circuit chip 10. That is to say, on the second support member 30, at portions (extremities) formed at one extremity of the second interconnecting lines 32 (for example, the end with a narrower pitch), an integrated circuit chip 10 is mounted. It should be noted that in the case of a liquid crystal panel, the second interconnecting lines 32 are electrically connected to liquid crystal drive electrodes (scan electrodes, signal electrodes, common electrodes, and the like). The second interconnecting lines 32 maybe formed of ITO (Indium Tin Oxide), Al, Cr, Ta or similar metal films, or metal compound films. The first and second support members 20 and 30, as shown in FIG. 2, are disposed to leave a gap. The integrated circuit chip 10 is mounted to bridge between the first and second support members 20 and 30. Between the first and second support members 20 and 30 is filled with a resin 40. By means of the resin 40, between the first and second support members 20 and 30 the surface of the integrated circuit chip 10, on which the first and second groups of electrodes 12 and 14 are formed, is covered.

Figure 4:
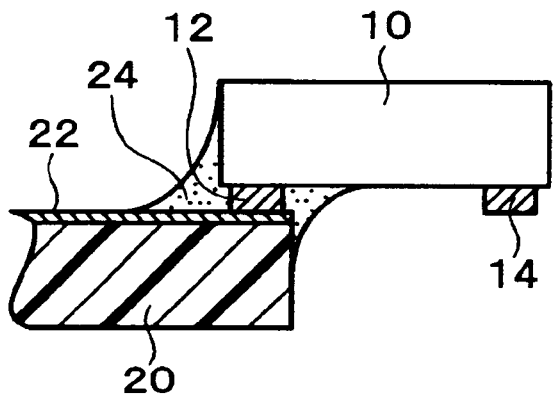
FIG. 4 is a diagram for illustrating a method of manufacturing an electronic device according to one embodiment of the present invention.

The electronic device of this embodiment is constituted as described above, and the method of manufacture thereof is now described. As shown in FIG. 4, in the method of manufacture of an electronic device, the first interconnecting lines 22 and the first group of electrodes 12 of the integrated circuit chip 10 are electrically connected. In this process, a device for carrying out COF mounting can be used. For the electrical connection of the first group of electrodes 12 and first interconnecting lines 22, an insulating resin bond (for example, a bond using NCP (non-conductive paste), NCF (non-conductive film), or the like), an anisotropic conductive material bond (for example a bond using ACF (anisotropic conductive film) or the like), an alloy bond (for example Au—Au or Au—Sn bond or the like), a solder bond or any such like known bonding method may be applied. Between the integrated circuit chip 10 and the first support member 20, an underfill material 24 may be provided. The underfill material 24 may double as NCP, NCF, or ACF.

In the process shown in FIG. 4, even if the first support member 20 is more liable to expand or contract under the influence of at least one of heat and humidity, as shown in FIG. 3, the first interconnecting lines 22 have a wider pitch than the second interconnecting lines 32. Therefore, even if the substrate expands or contracts under the influence of heat or humidity, the first interconnecting lines 22 and first group of electrodes 12 can be reliably electrically connected.

Figure 5:
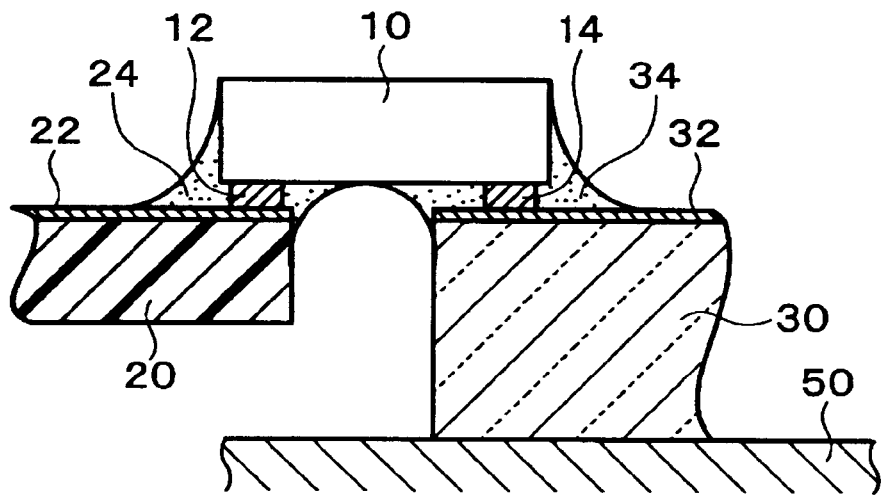
FIG. 5 is a diagram for illustrating a method of manufacturing an electronic device according to one embodiment of the present invention.

After the process shown in FIG. 4, as shown in FIG. 5, the second interconnecting lines 32 and the second group of electrodes 14 of the integrated circuit chip 10 are electrically connected. In this process, a device for carrying out COG mounting can be used. For the electrical connection of the second group of electrodes 14 and second interconnecting lines 32, an insulating resin bond (for example, a bond using NCP (non-conductive paste), NCF (non-conductive film), or the like), an anisotropic conductive material bond (for example a bond using ACF (anisotropic conductive film) or the like), an alloy bond (for example Au—Au or Au—Sn bond or the like), a solder bond or any suchlike known bonding method may be applied. Between the integrated circuit chip 10 and the second support member 30, an underfill material 34 may be provided. The underfill material 34 may double as NCP, NCF, or ACF. The second interconnecting lines 32 are arranged with a narrower pitch than the first interconnecting lines 22, but the second support member 30 is less liable than the first support member 20 to distort under the influence of at least one of heat and humidity. Therefore, the second interconnecting lines 32 and second group of electrodes 14 can be aligned with high precision.

In the process shown in FIG. 5, the integrated circuit chip 10 is already mounted on the first support member 20, but in this embodiment, the first support member 20 is a flexible substrate. In this case, since the first support member 20 is indeed flexible, the second interconnecting lines 32 and the second group of electrodes 14 can be electrically connected without applying stress to the electrical connection portion of the first interconnecting lines 22 and the first group of electrodes 12. In this embodiment, the first support member 20 is thinner than the second support member 30. Therefore, with the second support member 30 on a flat base 50, the second interconnecting lines 32 and the second group of electrodes 14 can be electrically connected. In this way, in this embodiment, the operability is excellent. Since only the part of the integrated circuit chip 10 on which the second group of electrodes 14 is provided is mounted on the second support member 30, the mounting region (the so-called frame) of the second support member 30 can be made small. Then, if required, as shown in FIG. 2, the resin 40 can be filled. The resin 40 covers the surface of the integrated circuit chip 10 on which the first and second groups of electrodes 12 and 14 are formed, between the first and second support members 20 and 30. By means of this, the connection portion can be mechanically reinforced. The resin 40 may cover the lateral surface of the integrated circuit chip 10. In this way the electronic device can be manufactured.

Figure 6:
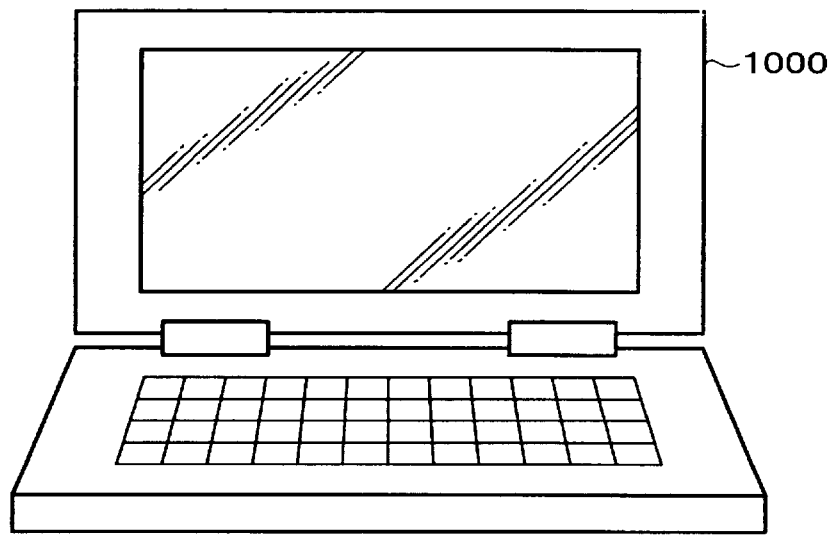
FIG. 6 is a diagram showing an electronic instrument according to one embodiment of the present invention.
Figure 7:
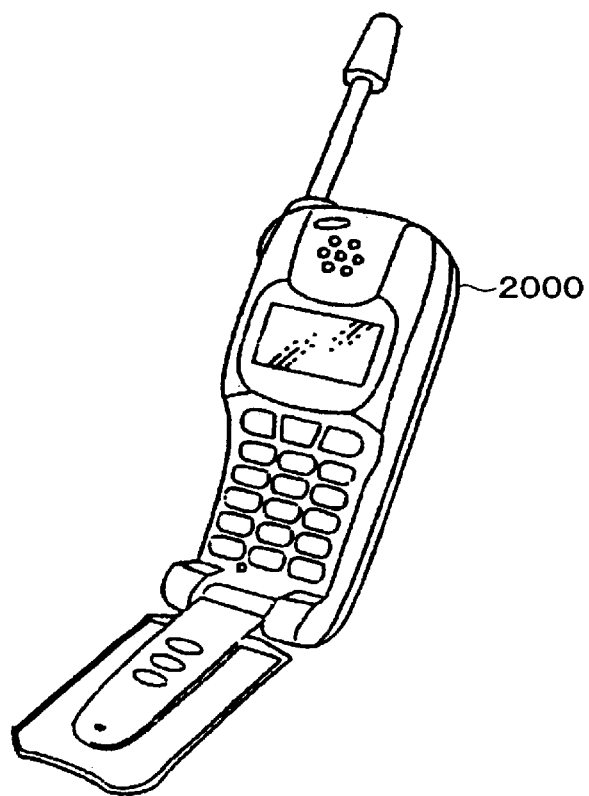
FIG. 7 is a diagram showing an electronic instrument according to one embodiment of the present invention.

As an electronic instrument having the above described electronic device, FIG. 6 shows a notebook personal computer 1000, and FIG. 7 shows a portable telephone 2000.

The present invention is not limited to the above-described embodiments, and various modifications can be made. For example, the present invention includes various other configurations substantially the same as the configurations described in the embodiments (in function, method and effect, or in objective and effect, for example). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

What is claimed is:

1. A method of manufacturing an electronic device comprising:

electrically connecting first interconnecting lines provided on a first support member respectively to a first group of electrodes of an integrated circuit chip; and then electrically connecting second interconnecting lines provided on a second support member respectively to a second group of electrodes of the integrated circuit chip, the second support member having a rate of deformation due to at least one of heat and humidity less than the deformation rate of the first support member, and the second group of electrodes having a pitch less than the pitch of the first group of electrodes of the integrated circuit chip.

2. The method of manufacturing an electronic device as defined in claim 1, wherein a gap is provided between the first support member and second support member.

3. The method of manufacturing an electronic device as defined in claim 2, wherein the first support member is a flexible substrate.

4. The method of manufacturing an electronic device as defined in claim 2, wherein the second support member is a glass substrate.

5. The method of manufacturing an electronic device as defined in claim 2, wherein the thickness of the first support member is less than the thickness of the second support member.

6. The method of manufacturing an electronic device as defined in claim 1, wherein the second support member is part of an electro-optic panel.

7. The method of manufacturing an electronic device as defined in claim 1, further comprising:

filling between the first and second support members with a resin.

8. An electronic device manufactured by a method comprising:

electrically connecting first interconnecting lines provided on a first support member respectively to a first group of electrodes of an integrated circuit chip; and then electrically connecting second interconnecting lines provided on a second support member respectively to a second group of electrodes of the integrated circuit chip, the second support member having a rate of deformation due to at least one of heat and humidity less than the deformation rate of the first support member, and the second group of electrodes having a pitch less than the pitch of the first group of electrodes of the integrated circuit chip.

9. An electronic instrument comprising an electronic device manufactured by a method including:

electrically connecting first interconnecting lines provided on a first support member respectively to a first group of electrodes of an integrated circuit chip; and then electrically connecting second interconnecting lines provided on a second support member respectively to a second group of electrodes of the integrated circuit chip, the second support member having a rate of deformation due to at least one of heat and humidity less than the deformation rate of the first support member, and the second group of electrodes having a pitch less than the pitch of the first group of electrodes of the integrated circuit chip.

* * * * *